United States Patent
Graves-Abe et al.

(10) Patent No.: US 8,476,168 B2
(45) Date of Patent: Jul. 2, 2013

(54) NON-CONFORMAL HARDMASK DEPOSITION FOR THROUGH SILICON ETCH

(75) Inventors: Troy L. Graves-Abe, Wappingers Falls, NY (US); Mukta G Farooq, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/014,114

(22) Filed: Jan. 26, 2011

(65) Prior Publication Data

US 2012/0190204 A1 Jul. 26, 2012

(51) Int. Cl.
*H01L 21/311* (2006.01)

(52) U.S. Cl.
USPC ............ 438/700; 438/736; 257/E21.257; 257/E21.258

(58) Field of Classification Search
USPC .......... 438/700, 717, 736, 618; 257/E21.257, 257/E21.258
See application file for complete search history.

(56) References Cited

U.S. PATENT DOCUMENTS

| | | | |
|---|---|---|---|
| 4,200,463 A | | 4/1980 | Flowers |
| 4,618,510 A * | | 10/1986 | Tan ............................ 438/571 |
| 5,126,288 A * | | 6/1992 | Nakagawa .................. 438/712 |
| 5,154,730 A | | 10/1992 | Hodos et al. |
| 5,688,719 A | | 11/1997 | Tsai et al. |
| 6,037,262 A * | | 3/2000 | Hsia et al. ................... 438/700 |
| 6,080,678 A | | 6/2000 | Yim |
| 6,171,163 B1 * | | 1/2001 | Seko et al. ..................... 445/24 |
| 6,268,283 B1 * | | 7/2001 | Huang ......................... 438/638 |
| 6,287,974 B1 * | | 9/2001 | Miller ......................... 438/706 |
| 6,383,853 B2 * | | 5/2002 | Hoshi ......................... 438/167 |
| 6,426,300 B2 | | 7/2002 | Park et al. |
| 2001/0018252 A1 | | 8/2001 | Park et al. |
| 2003/0153178 A1 * | | 8/2003 | Maile ........................... 438/670 |
| 2006/0205220 A1 * | | 9/2006 | Hudson et al. .............. 438/694 |
| 2009/0221148 A1 * | | 9/2009 | Uda et al. .................... 438/696 |
| 2010/0068885 A1 | | 3/2010 | Cirigliano et al. |
| 2010/0099046 A1 | | 4/2010 | Kim et al. |
| 2010/0159702 A1 * | | 6/2010 | Yamada et al. ............. 438/700 |

OTHER PUBLICATIONS

S. Wolf and R.N.Tauber, "Silicon Processing for the VLSI Era," vol. 1, Lattice Press, 2000, pp. 158-162.*
Troy Graves-Abe, "Molecular-scale Organic Electronic Devices for Integrated Nonvolatile Memory Application", A Dissertation, Jun. 2006.
Kevin Robbie, "Ultrahigh vacuum glancing angle deposition system for thin films with controlled three-dimensional nanoscale structure", Review of Scientific Instruments, vol. 75, No. 4, Apr. 2004, pp. 1089-1097.
Jyrki Kiihamaki, "Fabrication of SOI micromechanical devices", VTT Publications 559, Espoo 2005.

* cited by examiner

*Primary Examiner* — Julia Slutsker
(74) *Attorney, Agent, or Firm* — Katherine S. Brown (57) ABSTRACT

The present invention provides a method to form deep features in a stacked semiconductor structure. Deposition of a non-conformal hardmask onto a patterned topography can form a hardmask to protect all but recessed areas with minimal integration steps. The invention enables etching deep features, even through multiple BEOL layers, without multiple additional process steps.

16 Claims, 8 Drawing Sheets

NON-CONFORMAL HARDMASK DEPOSITION FOR THROUGH SILICON ETCH

FIELD OF THE INVENTION

The present invention relates to a stacked semiconductor structure, and a method of fabricating the same. More particularly, it relates to etching very high aspect ratio structures such as TSVs.

BACKGROUND OF THE INVENTION

Through Silicon Vias (TSVs) are an essential structure for 3D integration. TSVs enable vertical interconnects between chips or to a packaging substrate. Often, the ideal point to introduce the TSVs in the CMOS fabrication sequence is in the BEOL (back end of the line). The process used for creating TSVs then must etch through existing BEOL, MOL, and FEOL dielectrics that are already built on the wafer at the point of TSV introduction, and then continue the etch through the Si substrate until the desired depth of via has been attained, which typically corresponds to the final thickness of the substrate.

The requirement to etch through multiple BEOL dielectrics (which can reach a total thickness of 1 to 10 microns depending on where the TSVs are introduced) while leaving sufficient photoresist to mask the deep Si etch is very challenging. One option is to increase the thickness of the photoresist. But since the selectivity of many dielectrics in a typical dielectric etch is 1:1 to 2:1, the photoresist layer has to have a similar thickness to the dielectric being etched, e.g. 1 to 10 microns thick. New photoresist materials and tooling can be required, and lithography becomes more challenging as the thick resist limits the ability to print small features. Furthermore, the edge of the wafer must be protected by a ceramic ring during the etch (to prevent etching of the bevel). Any resist that extends under this ring must be removed after processing, which becomes more difficult as the resist is made thicker. Another option is to deposit a hardmask (e.g. silicon nitride, oxide, TiN, Al) as well as a photoresist layer. This complicates the integration as the hardmask must be deposited and patterned. Furthermore, the etch chemistry is typically chosen to have fast etch rates through the variety of dielectric films that are encountered in the back end of line, which makes it difficult to find a material with sufficient resistance to the etch to act as a suitable hardmask.

The drive to higher performance chips having greater density, energy efficiency, speed, etc. will require 3D integration, so there is a need to form TSVs by a method that minimizes consumption of materials and processing steps and requires little modification to current chip manufacturing lines.

SUMMARY OF THE INVENTION

According to the present invention, the problem of forming deep features such as a TSV after BEOL interconnects have been formed on a semiconductor substrate is solved by forming a non-conformal hardmask after forming a topography on the substrate. A non-conformal deposition technique in combination with an existing patterned topography allows the creation of a hardmask to protect all but the areas of the deep features with minimal integration steps. The invention enables etching deep features, even through multiple BEOL layers, without multiple additional process steps.

Specifically, and in broad terms, a method is provided that comprises: forming a patterned layer with at least one opening on a top surface of the substrate, the opening exposing at least one region on the substrate, etching to form a cavity into the exposed region, said cavity having a bottom surface, and depositing a non-conformal hard mask, said hardmask more thick over said top surface than over said bottom surface. The substrate may be a semiconductor wafer or chip on which BEOL layers have been formed.

In another embodiment of the present invention, a method is provided that comprises: forming at least one opening in a photo-patternable layer disposed on the substrate to expose at least one region on the substrate, and depositing a hardmask layer having a thickness over said photo-patternable layer, said hardmask layer having substantially no thickness over said at least one region. Etching can form a cavity through a top layer of said substrate, which etching can fully or partially consume the photo-patternable layer. The top layer may be a dielectric stack in which interconnect wiring has been formed to provide connection to underlying semiconductor devices.

In different embodiments, the hardmask may be deposited by CVD, or by angled deposition such as by evaporation, or angled PVD (physical vapor deposition or sputtering), and the substrate may be rotated during such deposition process. The hardmask can comprise an insulating material or can be formed of a metal or metal alloy.

DETAILED DESCRIPTION OF THE INVENTION

Embodiments of the present invention will now be described in greater detail by reference to the drawings that accompany the present application. It is noted that the drawings of the present application are provided for illustrative purposes only and are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
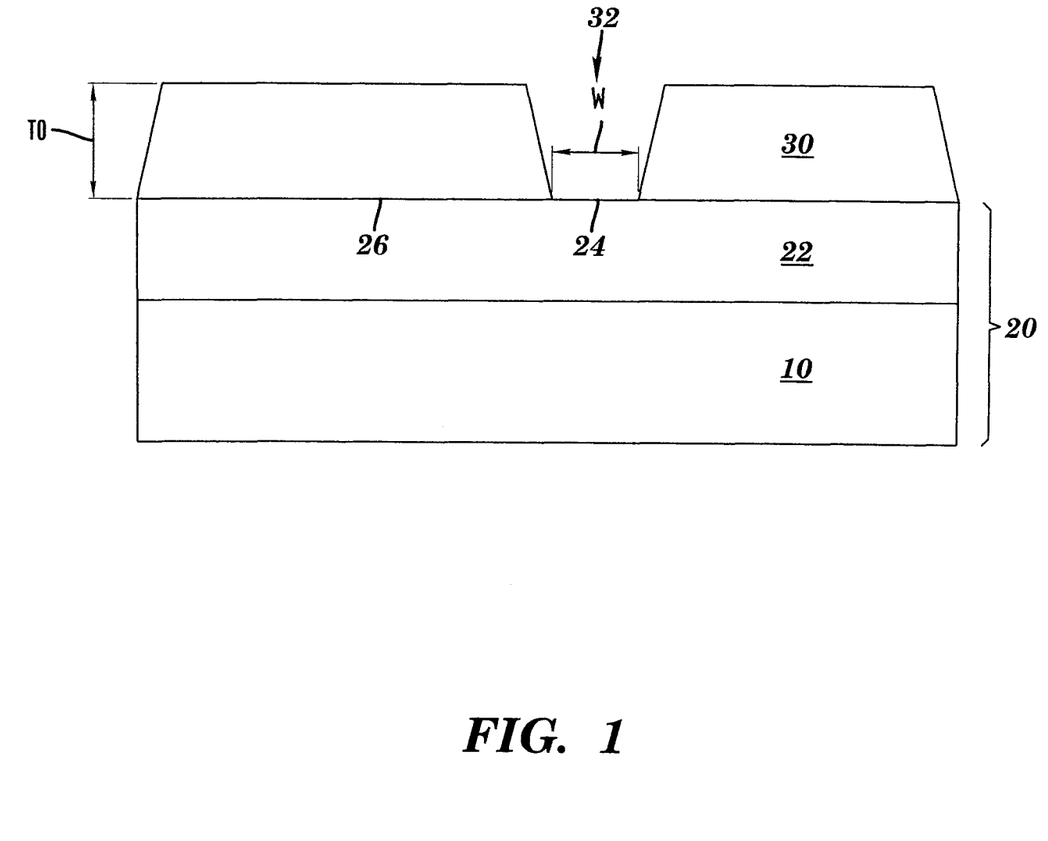
FIGS. 1-4 show a cross section of an exemplary structure illustrating a method to form a deep feature according to a first embodiment of the present invention wherein a hardmask is formed over a photo-patterned layer.

Reference is now made to FIGS. 1-4 which illustrate the basic processing steps that are employed according to a first embodiment of the present invention. FIG. 1 illustrates a photo-patternable layer 30 disposed on a substrate 20. Layer 30 can be any photoresist, which for purposes herein can be any photo-patternable composition, and can be patterned by known methods to form a mask over substrate 20, the mask consisting of photo-patternable layer 30 at a thickness T0, through which openings 32 have been formed to expose regions 24 on the top surface 26 of substrate 20. Opening 32 has an aspect ratio of height T0 vs width, W. Opening 32 is illustrated with sloped sidewalls, but it is also contemplated that opening 32 can be formed with vertical or even in-sloping sidewalls. Substrate 20 can comprise an insulating layer 22 overlying a semiconductor layer 10. Insulating layer 22 can be a dielectric stack within which a plurality of conductive features (not shown) is embedded. Semiconductor layer 10 can represent a single chip or a complete semiconductor wafer or any portion of a semiconductor wafer.

Insulating layer 22, when present, can comprise an organic insulator, an inorganic insulator or a combination thereof including multilayers, which can be doped or undoped silicate glass, silicon oxide, silicon nitride, organosilicate, BLoK™, NBLoK™ a low-k spin-on dielectric material such as SiLK™, thermosetting polyarylene ethers (referring to aryl moieties or inertly substituted aryl moieties which are linked together by bonds, fused rings, or inert linking groups such as, for example, oxygen, sulfur, sulfone, sulfoxide, carbonyl and the like), or any other type of dielectric material that can be deposited or formed on a substrate. As is known in the art, insulating layer 22 can also include materials for various purposes such as to act as an etch stop or to mitigate electromigration of conductive materials. Insulating layer 22 can comprise a combination of dielectric and conductive materials, and can represent one or multiple BEOL (back-end-of-the-line) interconnect levels of a multilayered interconnect structure, or can be just a passivation layer formed of any of the aforementioned dielectric materials, such as silicon nitride or silicon dioxide.

According to an embodiment, insulating layer 22 is a BEOL stack comprising multiple layers of dielectric material in which conductive interconnects are embedded. Such BEOL dielectric stack can be from 1 to 10 microns thick. A TSV can be formed before BEOL processing, or after some or all of the BEOL layers have been formed. Formation of the TSV may require etching several thicknesses, or even the entire thickness of the dielectric stack. The dielectric material of layer 22 can be any interlevel or intralevel dielectric including inorganic dielectrics or organic dielectrics, and may be porous or non-porous. The dielectric material of a given layer of the BEOL stack can be the same or different than that of adjacent layers.

Substrate 20 can be a semiconductor wafer that has completed conventional processing up to the point at which a TSV will be etched. Typically this would be after active and/or passive semiconductor devices have been formed in the front-end of the line, followed by contact formation to these devices and one or more levels of back-end of line (BEOL) metal wiring. Semiconductor layer 10 can have one or more semiconductor devices (not shown) fabricated thereon, for example, complementary metal oxide semiconductor (CMOS) devices, but this method is applicable for TSV formation at any point during processing, including immediately prior or after device formation or contact formation. For such embodiments, insulating layer 22 may be absent or may comprise typical front-end and contact-level insulators such as thermal oxide, CVD silicon oxide, and CVD silicon nitride.

The semiconductor layer 10 can be any semiconductor such as Si, Ge, SiGe, SiGeC, SiC, Ge alloys, GaAs, InAs, InP, other III/V or II/VI compound semiconductors, organic semiconductor materials, and other compound semiconductor materials. In addition to these listed types of semiconducting materials, the present invention contemplates cases in which the semiconductor layer 10 is a layered semiconductor such as, for example, Si/SiGe, Si/SiC, silicon-on-insulators (SOIs) or silicon germanium-on-insulators (SGOIs). Semiconductor layer 10 can be a single crystalline semiconductor material having perfect epitaxial alignment, such as single crystalline silicon.

Figure 2:
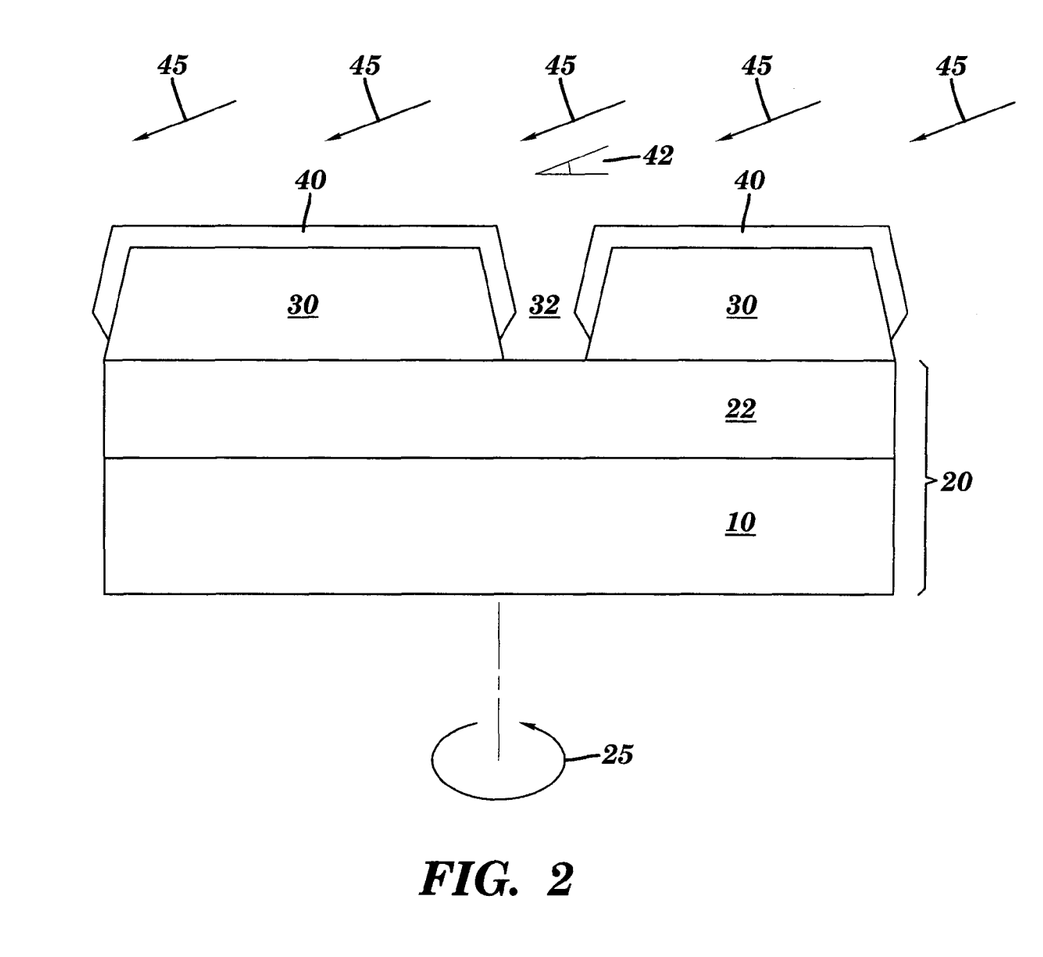

FIG. 2 illustrates deposition of a hardmask 40 over photo-patternable layer 30, which has been patterned to form openings 32. Hardmask layer 40 is formed by a non-conformal deposition technique such as angled evaporation or PVD whereby hardmask layer 40 forms more thickly over exposed surfaces of photoresist 30 than on the more remote surfaces of opening 32. In order to form a protective layer over the patterned photoresist while depositing little or no hardmask material on exposed regions 24, it is important to form appropriate topography with photoresist 30. In other words, photo-patternable layer 30 must have depth T0, and opening 32 must be of such width W, that opening 32 has sufficiently high aspect ratio (T0/W). Hardmask source material 45 can be provided at such angle 42 that, in combination with the aspect ratio of openings 32, the hardmask material does not contact (or only minimally deposits on) the area to be etched. Some deposition of the hardmask material typically occurs on the sidewalls of the photo-patternable layer 30. The thickness of the material deposited on the sidewalls may be similar to, or greater or less than the top thickness, depending on the deposition conditions. In the case of a line-of-sight deposition technique such as thermal evaporation, the preferred maximum allowable deposition angle is the arc tangent of the aspect ratio. For sputtering techniques, an additional safety margin of about 5 degrees lower than this limit is preferred. For example, openings 32 can have a low aspect ratio (less than 0.4), in which case appropriate non-conformal deposition can be achieved by using a very low deposition angle, such as less than 20 degrees or even less than 10 degrees. As aspect ratio increases from 0.4 to 2, the deposition angle can range from less than 30 degrees to about 60 degrees. For very large aspect ratios (about 3 or higher), the system is fairly insensitive to deposition angle. A workable deposition angle for a wide range of topography can be in the range of 10 to 50 degrees.

Substrate 20 can be rotated using for example, a ferromagnetic seal or turntable 25, during angled deposition in order to avoid asymmetric deposition. If the substrate is rotated, photoresist features with high levels of rotational symmetry are preferred. For example, circular features are preferable to oval shapes, and squares to rectangular shapes. The material of hard mask layer 40 can be an insulator or conductive and can be an oxide film, or a doped oxide film, such as SiOx, SiN, SiON, SiCN, W, TiN, Al, Ta, Si, Co, Ni, or TaN, or any combination thereof, as well as other materials known in the art. The deposition process is preferably conducted at temperatures that will not cause degradation of the photo-patternable composition, such as below about 250 C.

Figure 3:
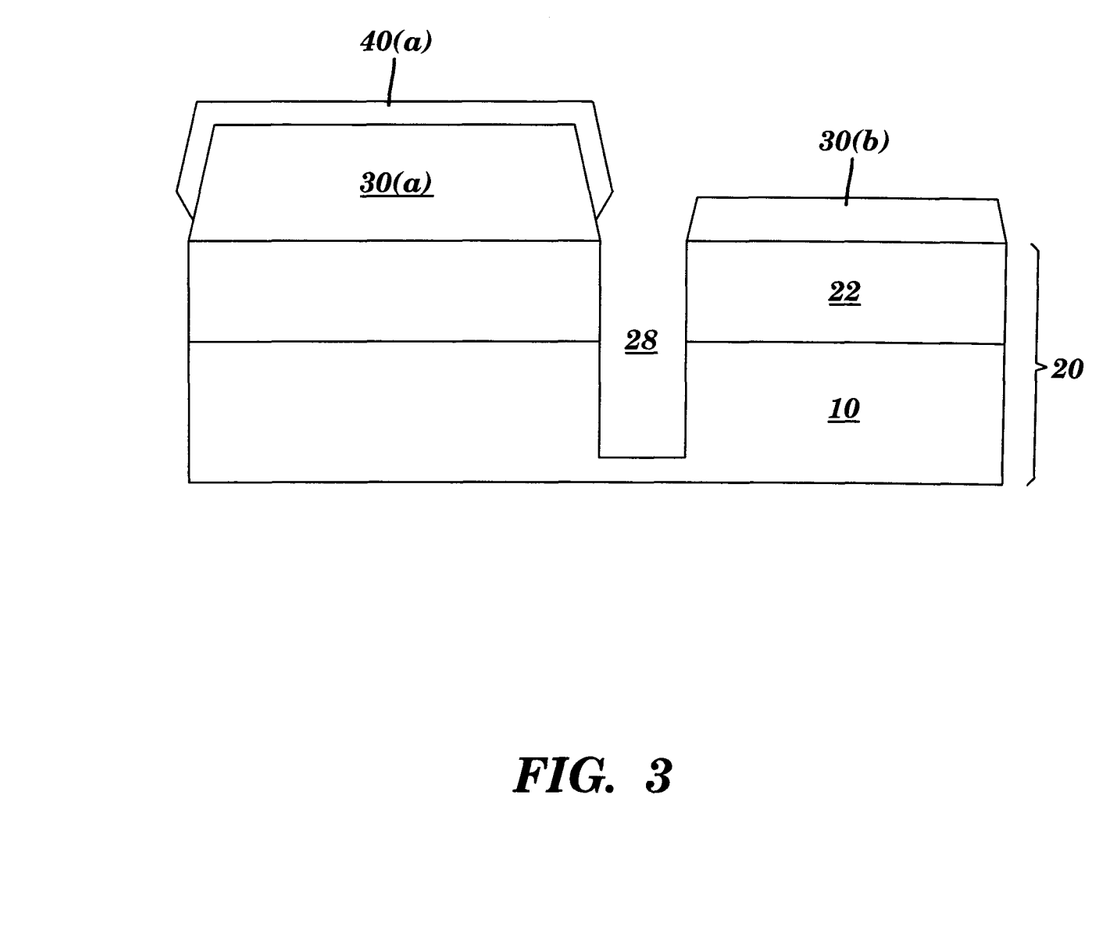

Referring now to FIG. 3, unlike a conventional hardmask, no resist is consumed to pattern hardmask 40, so both hardmask 40 and resist 30 constitute the mask during an etch step. In this arrangement, the hardmask can substantially increase the mask/resist budget which enables etching deep features 28 into substrate 20 through multiple dielectric layers 22 without fully consuming photo-patternable layer 30.

FIG. 3 illustrates that etch of substrate 20 to form cavity 28 may partially consume the hardmask 40(a). Or the etch of cavity 28 may fully consume hard mask 40, and may partially also consume photoresist 30(b). Optimally, hardmask 40 protects photoresist 30 long enough that the desired depth of cavity 28 can be etched without fully consuming photoresist 30. If the resist budget of photoresist 30 and hardmask 40 together is not sufficient to achieve the desired depth of cavity 28, a hardmask layer could be reformed by angled deposition after partial etch of cavity 28. Conceptually, repeating the hardmask deposition could extend the resist budget indefinitely. The material of such second or subsequent hardmask could be different than hardmask 40, as appropriate for the etch chemistry which may change as cavity 28 is formed through different layers.

Cavity 28 may be a deep trench, or a via. It may be desirable to build such structures to a depth of 10 microns or more, which may be between 15 and 50 microns, or even deeper. The present invention can enable forming such features with very small width, for example between 0.1 and 10 microns, but is not so limited and can also be used to form bigger features, for example having width up to 50 microns.

Figure 4:
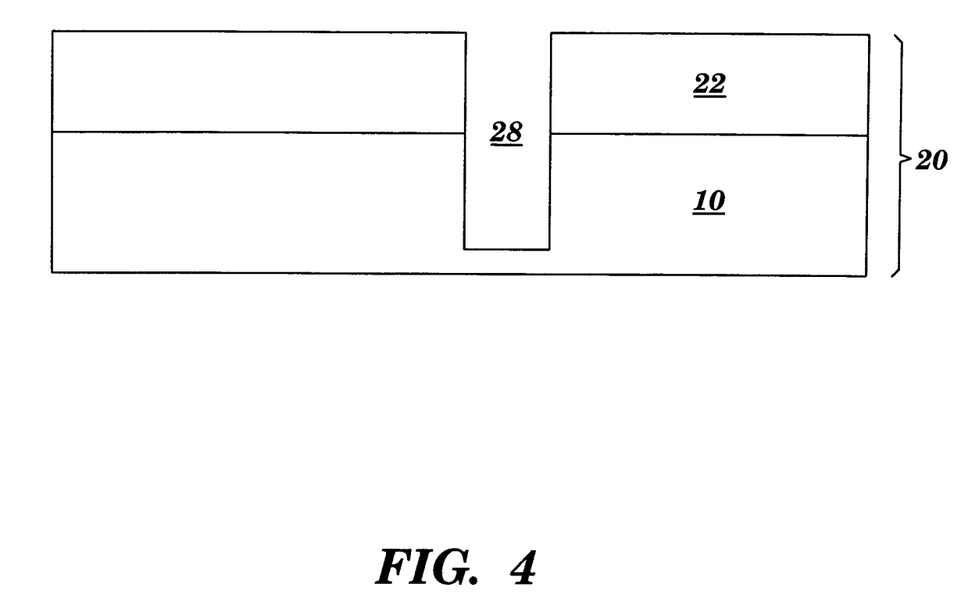

FIG. 4 illustrates that after cavity 28 is fully etched, the resist and any remaining hardmask can be removed. If the hardmask was not consumed during etch of cavity 28, it can be stripped by wet chemistry that also dissolves photoresist 30(a), similar to the lift-off approach that can be used to pattern metal lines. If hardmask 40 was fully consumed, photoresist 30(b) can be stripped using an O2 ash or other conventional dry and/or wet resist stripping methods known in the art.

Figure 5A:
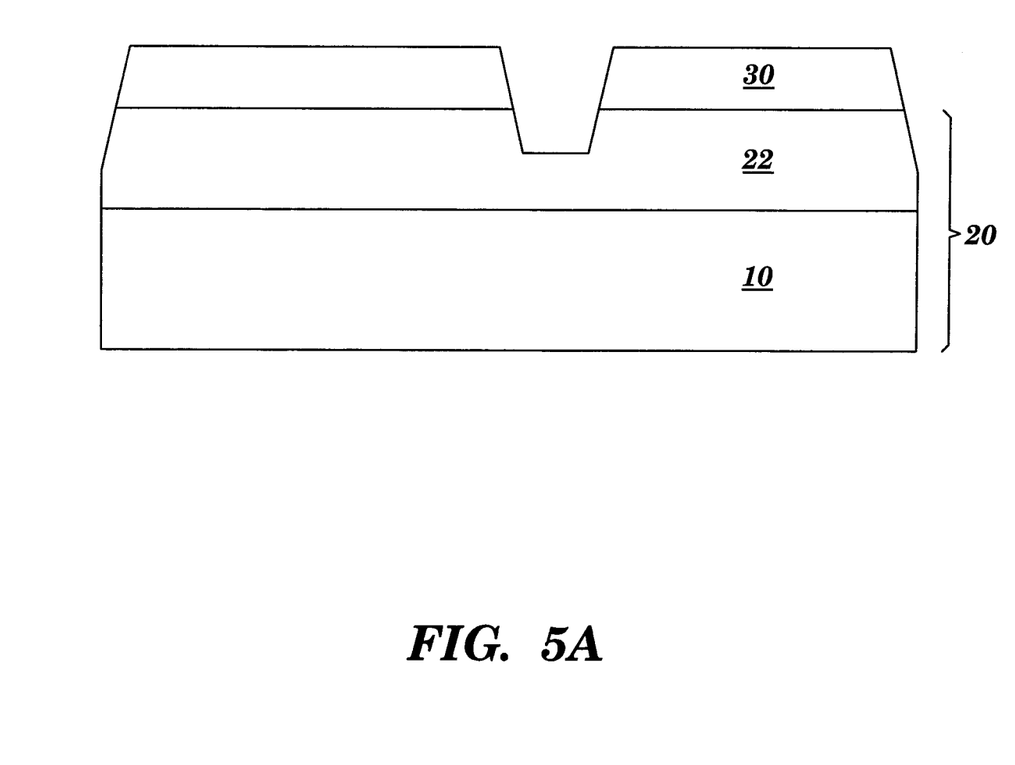
FIGS. 5A and 5B show progress of an etching step according to another embodiment of the present invention wherein hardmask is formed over an etched topography.
Figure 5B:
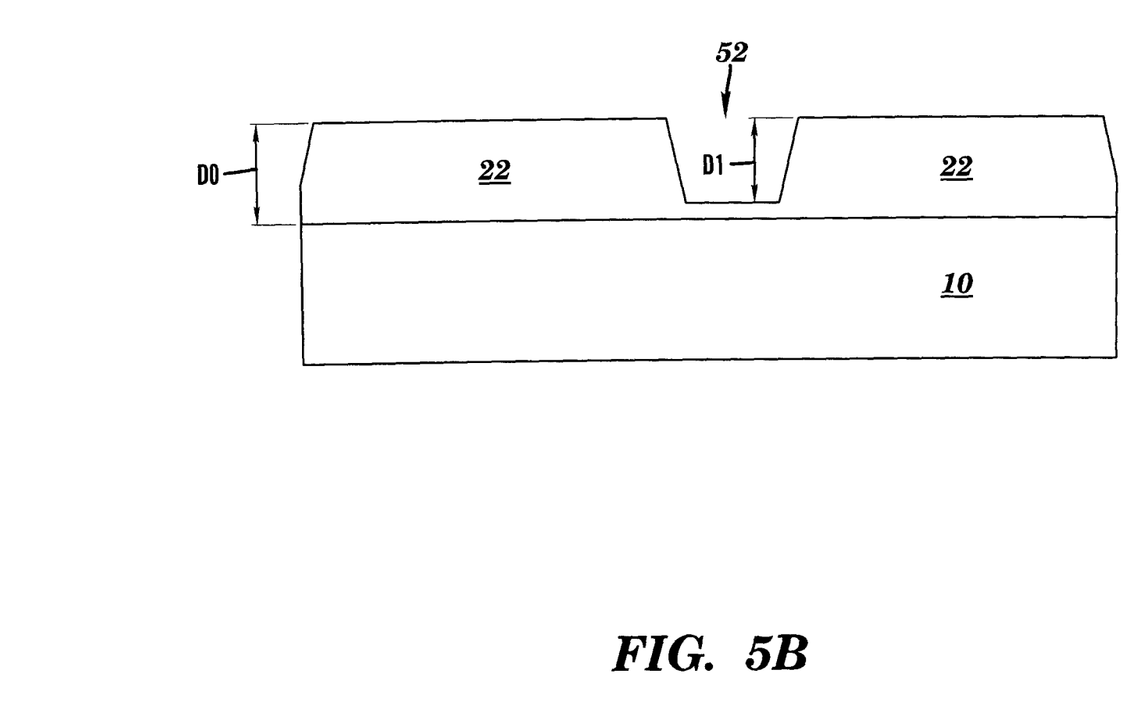

In a second embodiment, the substrate 20 is again processed up to the point of forming a deep feature. Substrate 20 can be a semiconductor wafer processed conventionally to the point of TSV etch. As in the first embodiment, a photo-patterned mask 30 can be formed with at least one opening 32 as shown in FIG. 1. According to the second embodiment, the structure is then etched according to the mask. The material of layer 22 and the resist material can have approximately equal selectivity (within +/−50%) to the etch chemistry, so as shown in FIG. 5A, photoresist 30 can be consumed as cavity is etched into substrate 20. FIG. 5B illustrates that etch of cavity 52 can timed to stop when photoresist 30 is partially or fully consumed. The resist mask is such that a significant topography can be formed in the substrate before the resist mask is fully consumed. If substrate 20 is a semiconductor wafer or chip processed through BEOL whereby the resist is disposed on the BEOL dielectric stack, this topography may extend partway (depth D1) or all the way (depth D0) through the dielectric stack, and possibly into the Si substrate. Substrate 20 can alternatively be a semiconductor wafer processed through the front end of the line (i.e., already having devices such as field effect transistors formed) or can be a substrate lacking such devices). Any resist mask that has not been consumed (not shown) can be stripped, leaving significant topography in the dielectric stack.

Figure 6:
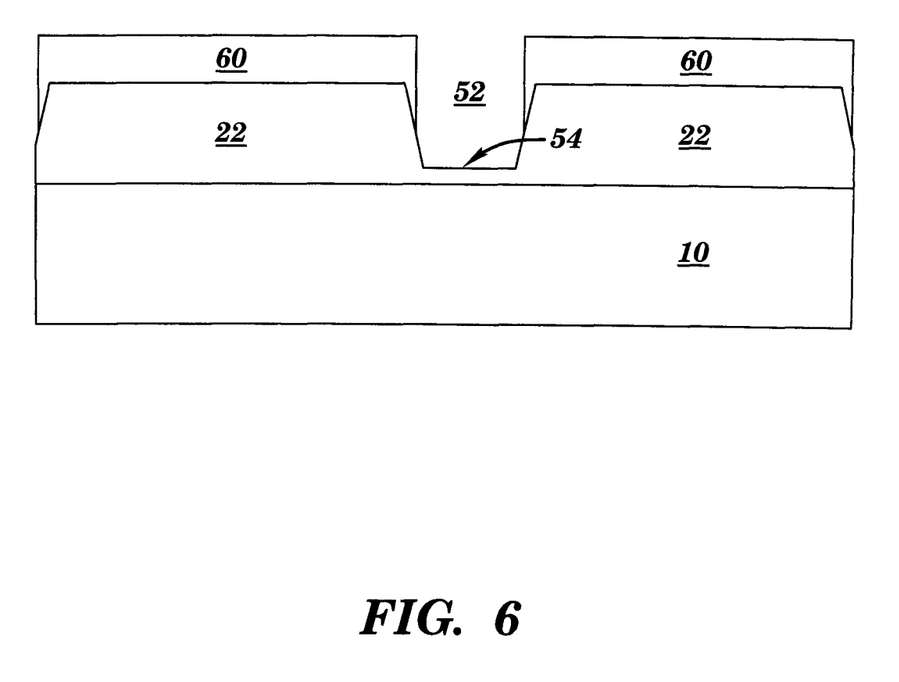
FIGS. 6 and 7 show further processing of the exemplary structure of FIGS. 5A and 5B according to an embodiment of the present invention.

A non-conformal deposition technique can be used to deposit a hardmask 60 on exposed top surfaces of substrate 20 and also on the upper side surfaces of cavity 52. Such technique can be angled evaporation or angled PVD, as in the first embodiment. However, as shown in FIG. 6, since the topography has been formed into the substrate rather than into a photoresist, a high temperature process such as CVD (chemical vapor deposition) can also be used, allowing greater flexibility in the choice of tooling and materials, as well as increased robustness of the mask layer. As for the first embodiment, the topography and non-conformal deposition can ensure that little or no hardmask material is deposited on the area to be etched. Optionally, if residual hardmask material (not shown) does deposit on the bottom surface 54 of cavity 52, a brief Argon sputter or etch chemistry suitable for etching the hardmask material, or any etching condition chosen to have a high sputtering component, can be used to completely remove the material at the bottom while leaving the bulk of the deposited material on the top of the feature.

Figure 7:
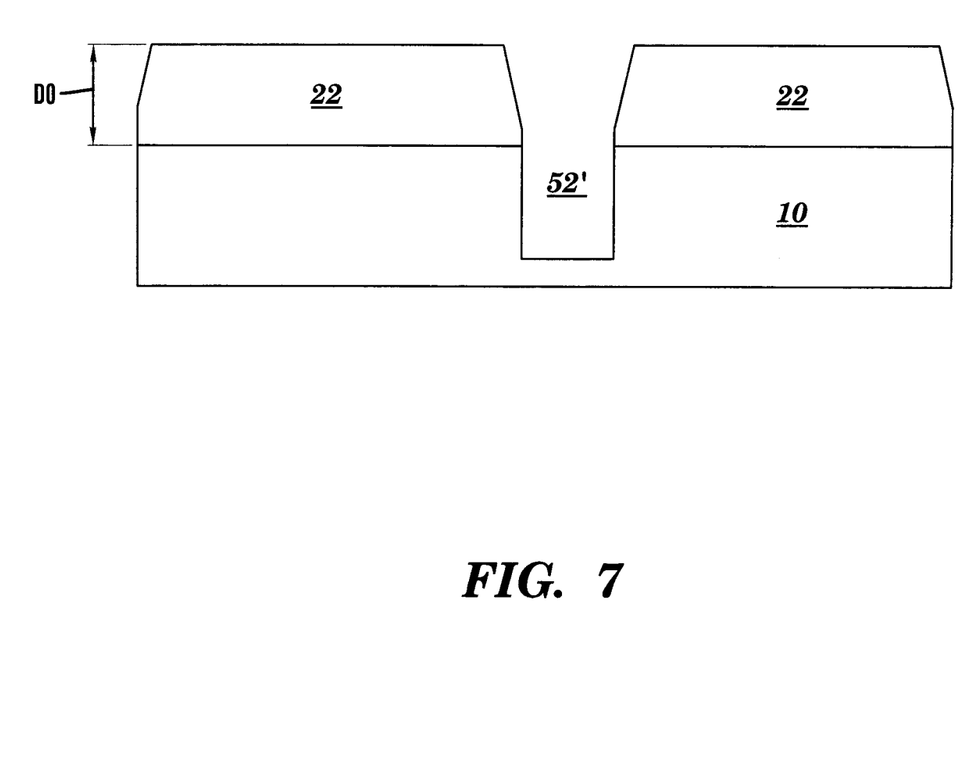

As illustrated in FIG. 7, etching can be continued to extend the cavity 52' through insulating layer 22 and as deep into semiconductor layer 10 as desired. Cavity 52' may be a deep trench, or a via, and can have the same dimensions and aspect ratios as cavity 28. If the first hardmask layer 60 is consumed or compromised before the desired depth can be reached, the non-conformal hardmask deposition process can be repeated to reinstate a hardmask. After reaching the target depth, any remaining hardmask material can be removed using conventional means.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the claims.

What is claimed is:

1. A method to form deep features in a substrate, the method comprising:
   forming a patterned layer having at least one opening on a top surface of said substrate whereby said opening exposes at least one region on said substrate,
   first etching to form a cavity in said at least one exposed region, said cavity with a width and a bottom surface at depth D1 below said top surface, and
   depositing a non-conformal first hardmask after said first etching, said first hardmask extending fully over said top surface, said first hardmask as deposited defining an open area over said bottom surface
   second etching according to said first hardmask to extend said cavity, and
   depositing a second hardmask layer after said second etching step, whereby said second hardmask layer has substantially no thickness over the bottom of said cavity.

2. The method of claim 1 wherein said substrate comprises insulating material overlying a plurality of devices formed in a semiconductor layer.

3. The method of claim 1 wherein said second hardmask is deposited by angled evaporation, CVD, or angled PVD.

4. The method of claim 2 wherein said insulating material constitutes at least two stacked dielectric layers that each having metal wiring embedded.

5. The method of claim 3 further comprising:
   rotating said substrate about an axis normal to said top surface during said second hardmask deposition.

6. The method of claim 3 wherein said angled evaporation or angled PVD provides deposition source material at an angle relative to said top surface between 10 and 50 degrees.

7. The method of claim 1 wherein said substrate comprises a semiconductor layer and said first etching forms a cavity that extends into said semiconductor layer.

8. The method of claim 1 wherein said second hardmask is not fully consumed by said second etching, the method further comprising stripping said second hard mask.

9. The method of claim 1 wherein said second hardmask is comprised of SiOx, SiN, SiON, SiCN, W, TiN, Al, Ta, Si, Co, Ni, or TaN, or any combination thereof.

10. A method to form deep features in a substrate, said method comprising:

provide a substrate comprising a plurality of interconnect layers disposed on a semiconductor layer, at least two of said interconnect layers comprising conductive interconnects embedded within a layer of dielectric material, etching to form a cavity according to a photoresist mask disposed on a top surface of said substrate, said etching consuming less than the entire photoresist mask, and depositing a non-conformal first hardmask after stripping said photoresist layer, said first hardmask extending fully over said top surface, said first hardmask as deposited defining an open area over said cavity.

11. A method to protect an upper surface topography while forming a deep cavity in a semiconductor substrate, the method comprising:

providing a layered structure comprising a semiconductor layer and a plurality of interconnect layers disposed on said semiconductor layer, at least two of said interconnect layers comprising metal wiring embedded within a layer of dielectric material;

forming a cavity through a top surface of said plurality according to a patterned mask, said cavity having sidewalls and a bottom surface;

while rotating said layered structure at least one full rotation about an axis normal to said semiconductor layer, depositing a hard mask at an angle offset from said axis such that said bottom surface is not covered by said hard mask; and extending said cavity into said semiconductor substrate by etching through said bottom surface.

12. The method of claim 11 wherein said depositing is achieved by evaporation or PVD.

13. The method of claim 11 wherein the depth of said cavity in combination with the angle of said deposition is such that a lower portion of said sidewalls and said bottom surface are not impinged by said deposition.

14. The method of claim 11 wherein said bottom surface is within said semiconductor layer prior to both said depositing and said extending steps.

15. The method of claim 11 wherein said hard mask is comprised of a nitride composition selected from SiN, SiON, SiCN, TiN, TaN, or any combination thereof.

16. The method of claim 11 further comprising depositing a second hardmask layer after said extending step, whereby said second hardmask layer has substantially no thickness over the bottom of said cavity.

* * * * *